United States Patent [19]

Moorman et al.

[11] Patent Number: 4,689,808
[45] Date of Patent: Aug. 25, 1987

[54] LOW NOISE SIGNAL DETECTION FOR A CHARGE TRANSFER DEVICE BY QUADRATURE PHASING OF INFORMATION AND RESET NOISE SIGNALS

[75] Inventors: Michael C. Moorman, Rochester, N.Y.; John F. Monahan, Medford, N.J.

[73] Assignee: RCA Corporation, Princeton, N.J.

[21] Appl. No.: 824,904

[22] Filed: Jan. 31, 1986

[51] Int. Cl.$^4$ .................. G11C 19/28; H04N 3/14
[52] U.S. Cl. ......................... 377/60; 358/213.18; 358/213.26
[58] Field of Search .................. 377/60, 57, 63; 328/167, 166; 307/265; 358/213

[56] References Cited

U.S. PATENT DOCUMENTS

| 4,151,474 | 4/1979 | Woollvin et al. | 328/167 |
| 4,301,471 | 11/1981 | Holscher et al. | 377/60 |
| 4,330,753 | 5/1982 | Davy | 329/50 |
| 4,398,062 | 8/1983 | McRae et al. | 328/166 |

OTHER PUBLICATIONS

Low Noise CCD Signal Recovery by Peter A. Levine, pp. 1534–1537 of IEEE Transactions on Electron Devices, vol. ED-32, No. 8, Aug. 1985.

Primary Examiner—Stanley D. Miller
Assistant Examiner—K. Ohralik
Attorney, Agent, or Firm—Eugene M. Whitacre; Peter M. Emanuel; James B. Hayes

[57] ABSTRACT

Charge transfer devices typically include a periodically reset floating element output stage coupled to an FET amplifier for sensing the transferred charges. For reducing both low-frequency 1/f noise and high-frequency reset noise, the duty factor of the device clocking signals and the reset signal are picked so that at a selected multiple of the clock signal repetition rate, the information component is in phase quadrature with the reset noise component. The charge transfer device output signal is then synchronously detected with a reference signal which is in phase with the selected multiple of the information component.

15 Claims, 5 Drawing Figures

LOW NOISE SIGNAL DETECTION FOR A CHARGE TRANSFER DEVICE BY QUADRATURE PHASING OF INFORMATION AND RESET NOISE SIGNALS

FIELD OF THE INVENTION

The present invention relates to synchronous detection of output signals from a charge transfer device, such as a charge coupled device (CCD) imager, including a periodically reset floating element output stage.

BACKGROUND OF THE INVENTION

Charge transfer devices such as CCDs have gained popularity in recent years for performing a wide variety of electronic functions including signal processing, signal delay and image sensing.

A CCD imager, for example, includes an array of charge collecting regions formed in a semiconductor substrate which is responsive to an incident radiation image for developing image-representative charge packets. The output of a CCD imager, as well as a CCD signal processor or delay line, includes a line register which receives the charge packets and serially transfers them to a charge sensing stage. The charge sensing stage includes a periodically reset floating element for developing a voltage signal in response to sensing of the serially supplied charge packets. Typically, an on-chip FET amplifier (electrometer) connected to the floating element provides the imager output signal. The FET amplifier contributes a noise component to the imager output signal commonly called "1/f" noise. The process of periodically resetting the floating element undesirably results in a "reset noise" component appearing in the imager output signal. Reset noise results from variations in potential left upon the floating element from one reset interval to the next. At the lower-video frequencies of the imager output signal 1/f noise predominates. At the upper-video frequencies of the imager output signal, reset noise predominates. Typically the reset noise is about 8 db larger than the 1/f noise.

L. N. Davy, in his U.S. Pat. No. 4,330,753 issued May 18, 1982 and entitled Method and Apparatus for Recovering a Signal From a Charge Transfer Device, describes a relatively low noise method for signal recovery from a charge transfer device output stage which includes a periodically reset FET coupled to a floating element. The FET output signal is passed through a bandpass filter (BPF) to separate out the double-sideband amplitude-modulated (DSB-AM) component centered about the sixth multiple of the clocking frequency. This DSB-AM signal is heterodyned using a synchronous detector type of demodulator to provide a baseband spectrum signal. The Davy method is effective for suppressing the 1/f noise component since the 1/f noise is principally confined to the lower frequency spectrum of the device output, which is suppressed by the BPF. Additionally, the relative duty factors of the clock signals and the device output signal are adjusted by Davy so that the amplitude of the clock signal components appearing about the sixth harmonic of the output signal are zero. This reduces clock feedthrough. It appears that although reset noise is not specifically identified by Davy, it may also be reduced by the above-noted adjustment of signals, however the information signal component of the output signal is relatively small at the sixth harmonic and therefore may have a poor signal-to-noise characteristic.

U.S. Pat. No. 4,556,851 issued Dec. 3, 1985 to Peter A. Levine entitled Reduction of Noise in Signal From Charge Transfer Devices and assigned, like the present application, to RCA Corporation, describes a charge sensing stage including a sample-and-hold circuit used as a detector. The sample-and-hold circuit operates in response to a sampling signal having a pulse repetition rate at the fundamental (rather than the sixth multiple) of the clock signal frequency for detecting the fundamental component of the output signal. An RC high-pass filter is used to differentiate the device output signal before its detection. The corner frequency of the RC high-pass filter is chosen to suppress the 1/f noise. Reset noise suppression is achieved by applying reset pulses to the floating element at times preceeding admission of charge packets under the floating element by intervals each substantially as long as the reciprocal of the corner frequency in radiants per unit time of the RC filter. Although this technique satisfactorily reduces the 1/f and reset noise, depending upon actual circuit construction techniques and layout, under varying temperature conditions the phase of the sampling signal applied to the detector may shift and give rise to an objectionable output signal shading component.

It is desirable to provide a charge sensing stage for a charge transfer device which reduces both 1/f and reset noise and is relatively insensitive to temperature variations.

SUMMARY OF THE INVENTION

In accordance with the principles of the present invention, a charge transfer device output signal supplied from a charge sensing stage which includes a periodically reset floating element, is synchronously detected using a reference signal which is in-phase with the information component at a selected multiple of the output signal repetition rate and substantially 90° out-of-phase with the reset noise component at the selected multiple of the output signal.

BRIEF DESCRIPTION OF THE DRAWINGS

In FIG. 1, the charge sensing apparatus of the invention is shown used with a semiconductor imager which, by way of example, is a CCD imager 10 of the field transfer type. CCD imager 10 includes an image (or A) register 11, a field storage (or B) register 12, and a parallel-input serial-output line (or C) register 13. Groups of lines of charge packets developed in A register 11 are regularly clocked through to B register 12 and then clocked forward one line at a time through C register 13 to a floating-diffusion type of charge sensing stage 14. Sensing stage 14 includes a potential well disposed under a floating diffusion 15 which receives the regularly clocked charge packets from the output of C register 13. Each charge packet discharges floating diffusion 15 in proportion to its amplitude. The amount of discharge is sensed by an electrometer (high input impedance amplifier) stage comprising a cascade connection of source-follower field effect transistors (FETs) 16 and 17. A direct potential OD is applied to the drain electrodes of FETs 16 and 17. A further FET 18 is connected as a constant current generator for FET 16. The output signal samples from CCD imager 10 are supplied via the source electrode of FET 17. After the amplitude of each charge packet is sensed, the potential on floating diffusion 15 is applied to the gate electrode of FET 16 is reset in response to a reset pulse $\phi_r$ applied to a reset gate 19. Reset gate 19 is disposed over a charge transfer channel 20 which extends through C register 13 and beyond to include floating diffusion 15, a reset drain 21 and DC gates 22 and 23. Additionally, a gate 24 which preceeds DC gate 22 is shown to indicate the last clocked gate of C register 13. DC gates 22 and 23 preceed and follow, respectively, floating diffusion 15 and serve to decouple floating diffusion 15 from the pulse signals applied to gates 24 and 19. The configuration of a CCD output stage including elements 15–24 is conventional for sensing a CCD output signal.

Figure 1:
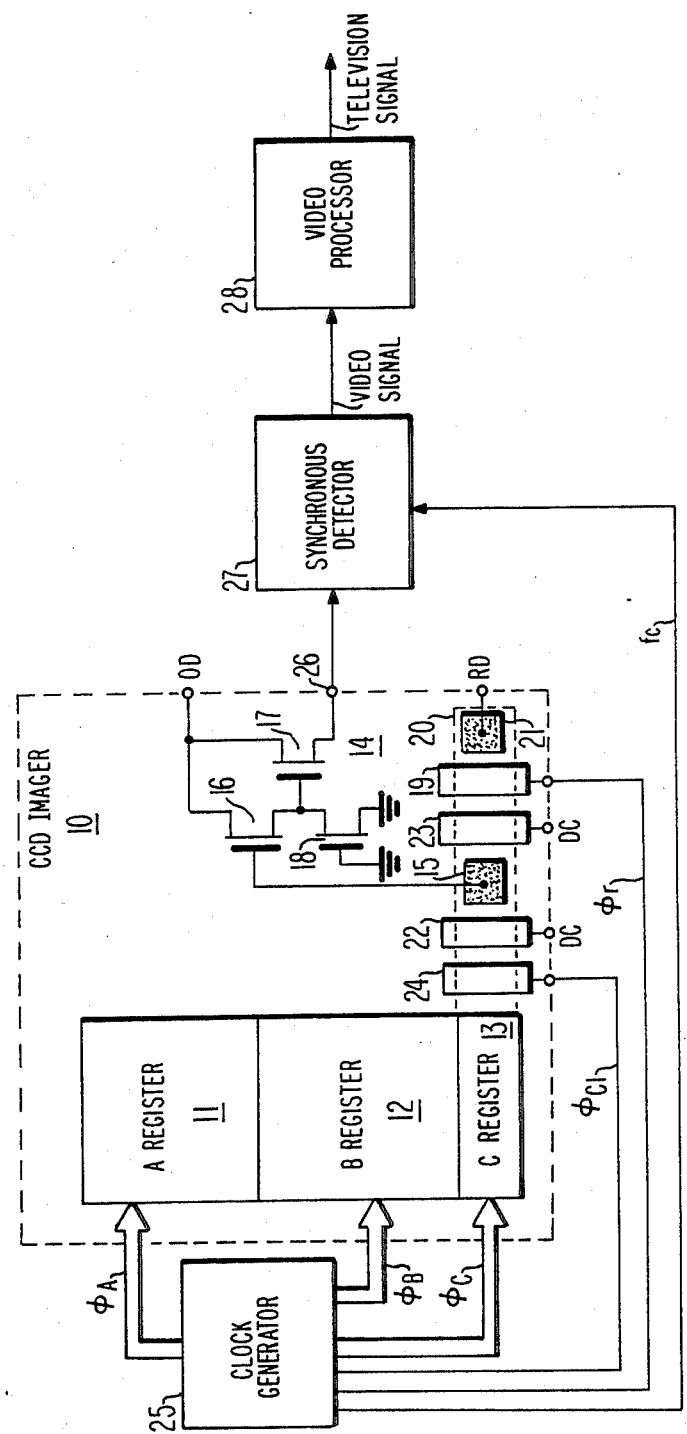
FIG. 1 illustrates, partially in block and partially in schematic diagram form, a television camera including a CCD imager using charge sensing apparatus constructed in accordance with the principles of the present invention.

A clock generator 25 develops and supplies respective sets of three-phase clocking signals $\Phi_A$, $\Phi_B$ and $\Phi_C$ to imager registers 11, 12 and 13, respectively, as well known for a CCD imager of the field transfer type. Clock generator 25 also generates the $\Phi_r$ pulse which is applied to gate electrode 19 of sensing stage 14 and generates a $f_c$ reference signal which is applied to a synchronous detector 27.

Figure 2:
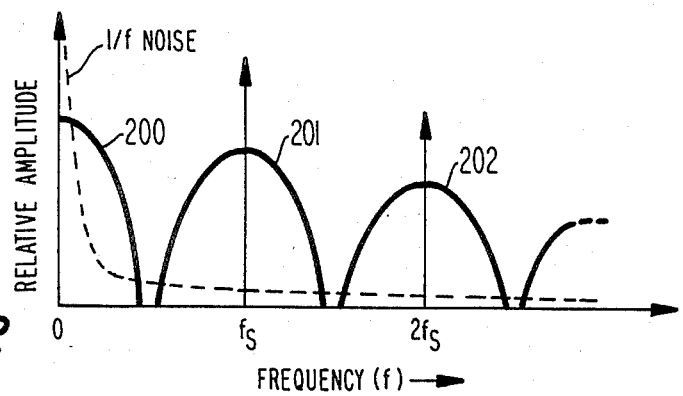
FIG. 2 illustrates an idealized output signal frequency spectrum for the CCD imager of FIG. 1.

The output signal of CCD imager 10 appears at an output terminal 26 and its frequency spectrum is illustrated in FIG. 2. The frequency spectrum of the output signal consists of a baseband frequency portion 200 which includes the image-representative signal information as well as a substantial portion of the low-frequency 1/f noise, illustrated by the dashed line. Since the CCD output signal is a sampled analog signal, the image-representative signal information is also repeated as double-sideband amplitude-modulated (DSB-AM) information about multiples of the sampling frequency ($f_s$), as illustrated by waveforms 201 and 202 for the fundamental and second harmonic, respectively, of $f_s$. Sampling frequency $f_s$ corresponds to the frequency of the $\Phi_C$ clock signals and is therefore equal to the repetition rate of the CCD output signal.

Referring again to FIG. 1, the CCD output signal is applied from terminal 26 to one input of a synchronous detector 27, which may comprise in a preferred embodiment a balanced modulator such as the MC1496 integrated circuit commercially available from Motorola Corporation. In response to the $f_c$ reference signal applied to its other input, detector 27 detects the fundamental component of the CCD output signal and provides it as a baseband video signal at its output. The baseband video signal is then processed via a conventional television video signal processor 28 for developing at its output a television signal.

In accordance with a principle of the present invention, the reset noise and signal information components at a selected multiple of the CCD output signal repetition rate are in phase quadrature. Thus, a reference signal $f_c$ in-phase with the signal information component will cause synchronous detector 27 to synchronously detect the information component while the reset noise component of the CCD output signal, which is in phase quadrature with $f_c$, is substantially rejected at the output of synchronous detector 27. Furthermore, by detecting a multiple of the CCD output signal repetition rate, the low-frequency 1/f noise is substantially eliminated.

Figure 3:
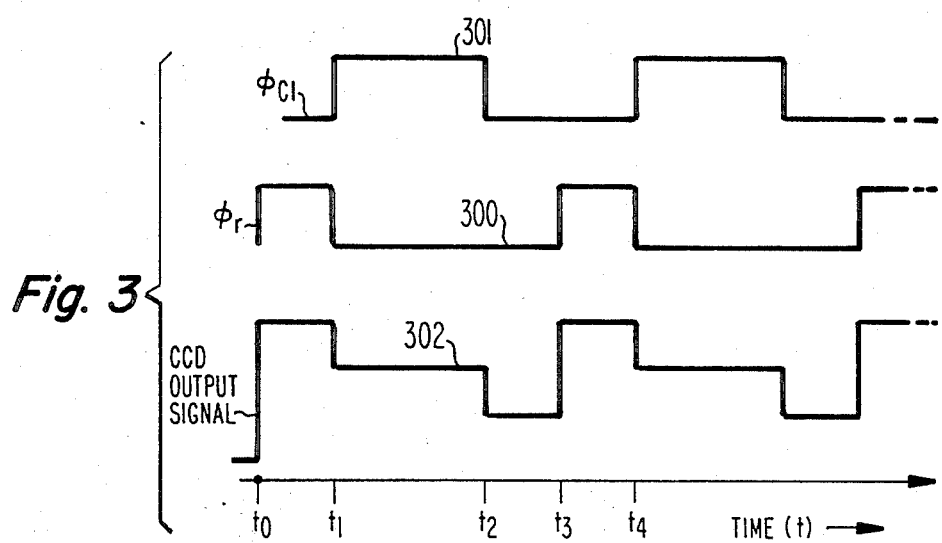
FIG. 3 illustrates waveforms useful for understanding the operation of the charge sensing apparatus of FIG. 1.

The operation of charge sensing stage 14 of FIG. 1 will next be described in greater detail in conjunction with the waveforms of FIG. 3 and the graph of FIG. 4 in order to show how the CCD output signal is caused to have the above-noted characteristic. In FIG. 3, time-amplitude waveform 300 illustrates the $\Phi_r$ reset signal, time-amplitude waveform 301 illustrates a 101 $_{cl}$ clock signal (i.e., one of the $\Phi_C$ clock signals) which is applied to gate 24 and time-amplitude waveform 302 illustrates an idealized version of the CCD output signal appearing at output terminal 26. During times $t_0-t_1$, $t_3-t_4$, etc., $\Phi_r$ is at a positive potential which is sufficient to allow the charge under floating diffusion 15 to drain a potential RD applied to reset drain 21. Thus, during these times waveform 302 maintains a fixed potential. However, when the reset pulse goes low, i.e., at time $t_1$, floating diffusion 15 is driven negatively by coupling from reset gate 19 and its potential level is set to a new level which represents zero charge. This new level is slightly different for each pixel interval, i.e., the interval between $\Phi_r$ reset pulses, due to thermally generated noise associated with the resetting process. This gives rise to the forenoted reset noise component which appears between times $t_1-t_3$, etc. At time $t_2$ the potential of the $\Phi_{cl}$ clock signal changes to a level which is sufficient to cause a charge packet to transfer past DC gate 22 and under floating diffusion 15, thereby discharging floating diffusion 15 in proportion to the amplitude of the charge packet. Thus, at time $t_2$ the potential level of waveform 302 changes by an amount dependent upon the amplitude of the image-representative signal component. At time $t_3$ the level of the CCD output signal is again reset in response to the positive going $\Phi_r$ reset signal. Thus, the image-representative information signal component only appears in waveform 302 between times $t_2-t_3$ and the reset noise signal component only appears between times $t_1-t_3$. It is noted that the duty factor of the information component of the output signal is $(t_2-t_3)/(t_0-t_3)$ and the duty factor of the reset noise component of the output signal is $(t_1-t_3)/(t_0-t_3)$.

Figure 4:
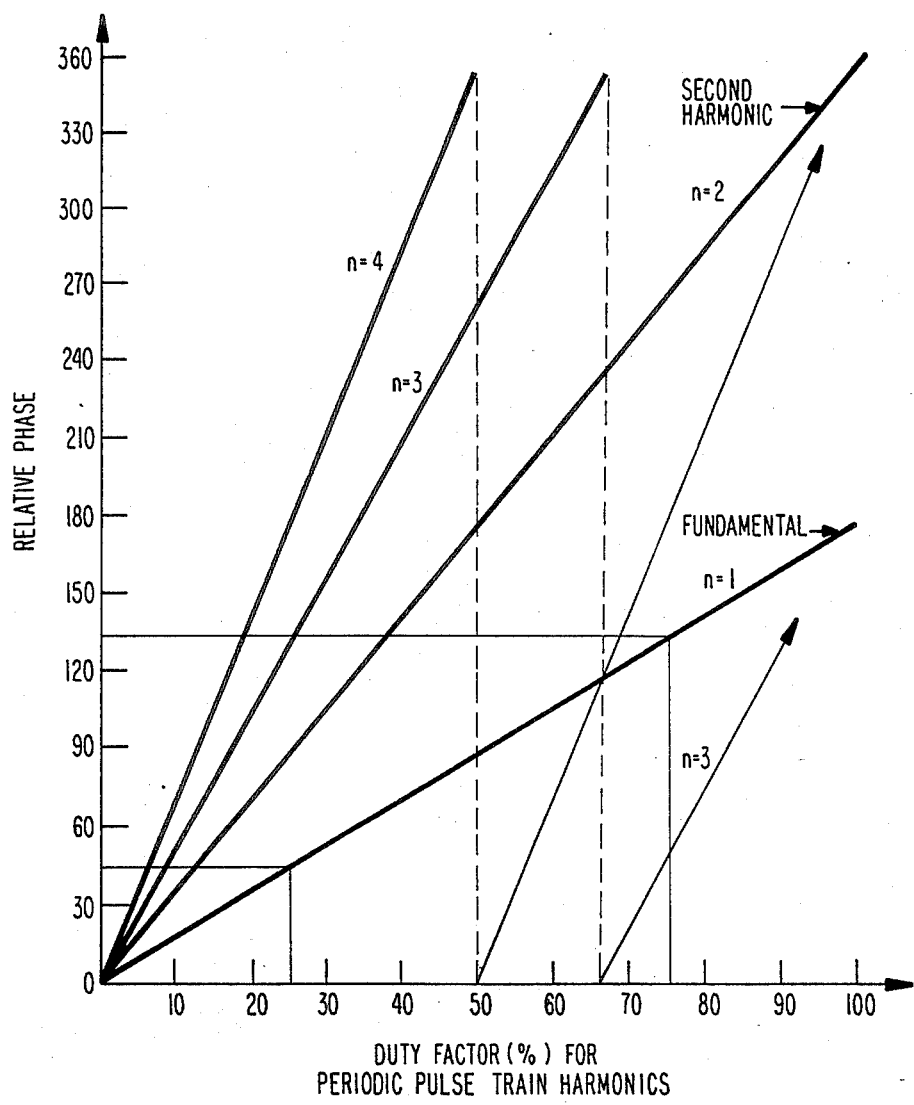
FIG. 4 illustrates a graph of the phase versus duty factor relationship for harmonics of a periodic pulse train signal.

FIG. 4 illustrates a graph of the results of the Fourier analysis of the phase versus duty factor relationship for selected harmonically related pulse signals. Note for example, that where the harmonic value N equals 1, i.e., at the fundamental frequency, a 75% duty factor pulse train corresponds to a 135° phase angle with respect to a reference angle while a 25% duty factor corresponds to a 45° phase angle with respect to the reference angle. Thus, at the fundamental frequency of a pulse train signal, a signal component having a 75% duty factor will be in phase quadrature with a signal component having a 25% duty factor. It is clear from FIG. 4 that other duty factor relationships exist (e.g., 20%/70% or 30%/80%) for establishing the desired phase quadrature relationship at the fundamental frequency and that such a phase quadrature relationship can be established at other multiples of the pulse train repetition rate. In the preferred embodiment of the invention, the fundamental of the information signal component is detected since its signal level at the fundamental is greater than its signal level at higher order multiples of the fundamental.

Thus, the duty factor of the $\Phi_{Cl}$ and $\Phi_r$ signals are set so that at the fundamental frequency of the CCD output signal, $f_s$, the image-representative information signal component is in phase quadrature with the reset noise signal component. From examining FIG. 3 it can be seen that the $\Phi_r$ and $\Phi_{Cl}$ signals are of the same frequency, have 25% and 50% duty factors, respectively, and the leading edge of the $\Phi_{Cl}$ signal is in phase with the trailing edge of the $\Phi_r$ signal (i.e., they coincide at time $t_1$, $t_4$, etc.). This relationship establishes the desired phase quadrature relationship between the information and reset noise components at the fundamental frequency of the CCD output signal. Consequently, clock generator 25 supplies reference signal $f_c$ at a frequency equal to $f_s$ and in-phase with the information component. In practice, this phase relationship can be easily determined using a variable phase frequency generator as the source of $f_c$. As a result, synchronous detector 27 detects the information signal component while substantially rejecting the reset noise component.

It is well known that the output amplitude response of a synchronous detector is relatively insensitive to phase variations when detecting the in-phase component of its input signal. Thus, the signal detection apparatus of the present invention also results in greatly reduced video signal shading (amplitude modulation) as a result of, for example, temperature change induced phase shifts, as compared with a signal detection apparatus of the type which requires a precisely positioned sampling pulse. Although temperature induced phase shifts may result in less rejection by synchronous detector 27 of the reset noise signal component, this effect is much less objectionable than the forenoted video signal shading problem which may be encountered in the prior art.

Figure 5:
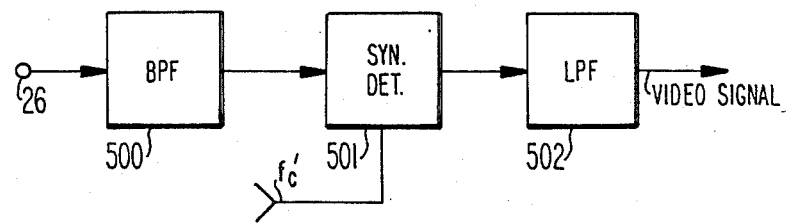
FIG. 5 illustrates an alternative embodiment of the inventive charge sensing apparatus.

In FIG. 1, synchronous detection is accomplished by applying a sine wave of frequency $f_C$ as the reference signal to synchronous detector 27. In an alternative embodiment of the invention illustrated by FIG. 5, a reference signal $f_C'$ is applied to a synchronous detector 501. Detector 501 is substantially the same as detector 27 of FIG. 1, however, reference signal $f_C'$ comprises a square wave. The fundamental frequency and phase angle of the $f_C'$ square wave is the same as the $f_C$ sine wave reference signal of FIG. 1. However, since a square wave is applied to synchronous detector 501, it will cause detection of not only the fundamental component of the CCD output signal but also detection of its odd harmonic components. A bandpass filter 500 prefilters the CCD output signal so that substantially only the fundamental DSB-AM signal component is applied to synchronous detector 501. A lowpass filter (LPF) 502 passes the baseband component of the detector output signal while rejecting the signal components centered at the odd harmonics of the $f_C'$ reference signal.

While the invention has been described in connection with field transfer type CCD imagers, it should be clear that the invention is equally useful for other types of imagers as well as other types of charge transfer devices such as delay lines, signal processors, etc., where there is a need for reduction of reset noise in the device output signal. Furthermore, although charge sensing stage 14 was of the type which included a floating diffusion, it should be clear that other types of periodically reset floating elements, such as a floating gate, could also be used to sense the amplitude of transferred charge packets.

What is claimed is:

1. Apparatus for recovering an information signal component from an output signal produced by a charge transfer device which also includes a thermally generated reset noise component which is variable from pixel to pixel, comprising:
   a charge transfer device including a charge transfer channel;
   a plurality of gate electrodes overlying said charge transfer channel and receptive of clock signals for transferring charge packets through said charge transfer channel;
   a floating element coupled to said charge transfer channel at a point which follows at least one of said gate electrodes;
   means for periodically resetting said floating element to a reference potential in response to a reset signal;
   an output stage coupled to said floating element for supplying a sampled output signal having a given repetition rate;
   a synchronous detector, responsive to said sampled output signal and a reference signal for synchronously detecting said information signal component and providing said baseband information signal at its output; and
   signal generating means for generating said clock, reset and reference signals so that said reference signal has the same frequency and phase as the information signal component at the fundamental frequency of said output signal repetition rate but is substantially in phase quadrature with said thermally generated reset noise component at said fundamental frequency.

2. The apparatus according to claim 1 wherein:
   said signal generating means provides said clock signals with a first duty factor to said at least one gate electrode which proceeds said floating element and said reset signal with a second duty factor and phase with respect to said clock signals to said means for periodically resetting said floating element such that said sampled output signal includes at the fundamental frequency of its repetition rate an information signal component which is in phase quadrature with the thermally generated reset noise component.

3. Apparatus according to claim 2 wherein:
   the difference in duty factor between said first and second duty factors is 25%.

4. Apparatus according to claim 3 wherein:
   said first duty factor is 50% and said second duty factor is 25%.

5. Apparatus according to claim 1 wherein:
   said information and reset components comprise third and fourth duty factors, respectively, of said sampled output signal.

6. Apparatus according to claim 5 wherein:
   the difference in duty factor between said third and fourth duty factors is 50%.

7. Apparatus according to claim 6 wherein:
   said third and fourth duty factors are 25% and 75%, respectively, of said sampled output signal.

8. In combination with a charge transfer device arranged to be receptive of a periodic pulse train clock signal for transferring charge packets therethrough and a floating element charge sensing stage responsive to said transferred charge packets and a periodic pulse train resetting signal for providing a charge transfer device output signal including an information signal component and a thermally generated reset noise signal component which is variable from pixel to pixel, low thermally generated reset noise signal recovery apparatus comprising:

clock generator means for providing said periodic pulse train clock signal at a first duty factor and said periodic pulse train resetting signal at a second duty factor and with a predetermined phase relationship with respect to said clock signal, such that at the fundamental frequency of the repetition rate of said charge transfer device output signal provided by said floating element charge sensing stage, said information signal component is in a phase quadrature relationship with respect to said thermally generated reset noise signal component; and a synchronous detector, responsive to said charge transfer device output signal and a reference signal for synchronously detecting the information signal component of said charge transfer device output signal at said fundamental frequency of said repetition rate.

9. Apparatus according to claim 8 wherein the frequency of said periodic pulse train clock and resetting signals are the same.

10. Apparatus according to claim 9 wherein said floating element charge sensing stage comprises:

a floating diffusion;

means for periodically resetting said floating diffusion to a reference potential in response to said resetting signal; and an amplifier stage coupled to said floating diffusion for supplying said charge transfer device output signal.

11. Apparatus according to claim 8 wherein:

the difference in duty factor between said first and second duty factors is substantially 25%.

12. In combination with a charge transfer device arranged to be receptive of a periodic pulse train clock signal for transferring charge packets there through and a floating element charge sensing stage responsive to said transferred charge packets and a periodic pulse train resetting signal for providing a periodic charge transfer device output signal, each period of said output signal including a first portion occupied by an information signal component and a second portion occupied by a thermally generated reset noise signal component which is variable from pixel to pixel, low thermally generated reset noise signal recovery apparatus comprising:

clock generator means for providing said periodic pulse train clock signal at a first duty factor and said periodic pulse train resetting signal at a second duty factor and with a predetermined phase relationship with respect to said clock signal, such that the difference between said first and second portions of said period substantially equals a one-half portion of said period; and a synchronous detector, responsive to said charge transfer device output signal and a reference signal for synchronously detecting the fundamental frequency information signal component of said charge transfer device output signal.

13. Apparatus according to claim 12 wherein said floating element charge sensing stage comprises:

a floating diffusion;

means for periodically resetting said floating diffusion to a reference potential in response to said resetting signal; and an amplifier stage coupled to said floating diffusion for supplying said charge transfer device output signal.

14. Apparatus according to claim 12 wherein the frequency of said periodic pulse train clock and resetting signals are the same and the difference in duty factor between said first and second duty factors is substantially 25%.

15. Apparatus according to claim 14 wherein said first and second portions substantially equal 25% and 75%, respectively of said output signal period.

* * * * *